(12) United States Patent
Okuno et al.

(10) Patent No.: US 11,167,355 B2
(45) Date of Patent: Nov. 9, 2021

(54) CUTTING TOOL

(71) Applicant: SUMITOMO ELECTRIC HARDMETAL CORP., Itami (JP)

(72) Inventors: Susumu Okuno, Itami (JP); Shinya Imamura, Itami (JP); Satoshi Ono, Itami (JP); Anongsack Paseuth, Itami (JP)

(73) Assignee: SUMITOMO ELECTRIC HARDMETAL CORP., Itami (JP)

(*) Notice: Subject to any disclaimer, the term of this patent is extended or adjusted under 35 U.S.C. 154(b) by 0 days.

(21) Appl. No.: 16/637,038

(22) PCT Filed: Jul. 5, 2019

(86) PCT No.: PCT/JP2019/026821
§ 371 (c)(1),
(2) Date: Feb. 6, 2020

(87) PCT Pub. No.: WO2020/079894
PCT Pub. Date: Apr. 23, 2020

(65) Prior Publication Data
US 2021/0008633 A1    Jan. 14, 2021

(30) Foreign Application Priority Data

Oct. 15, 2018  (JP) ................ 2018-194134

(51) Int. Cl.
*B23B 27/14* (2006.01)
*B23B 51/00* (2006.01)
(Continued)

(52) U.S. Cl.
CPC .............. *B23B 27/14* (2013.01); *B23B 51/00* (2013.01); *B23C 5/16* (2013.01); *C23C 28/044* (2013.01); *C23C 28/3455* (2013.01)

(58) Field of Classification Search
CPC ........ B23B 27/14; B23B 51/00; C23C 28/044; C23C 28/3455; B23C 5/16
See application file for complete search history.

(56) References Cited

U.S. PATENT DOCUMENTS 9,238,267 B2 * 1/2016 Stiens .................. C23C 30/005
2004/0224159 A1  11/2004 Oshika et al.
(Continued)

FOREIGN PATENT DOCUMENTS

EP  2 287 359 A1  2/2011
EP  3 437 772 A1  2/2019
(Continued)

OTHER PUBLICATIONS

Okuno, Susumu, et al., "Cutting Tool," U.S. Appl. No. 16/637,019, filed Feb. 6, 2020, including as-filed specification, claims, abstract and drawings, 46 pages.
(Continued)

*Primary Examiner* — Pegah Parvini
*Assistant Examiner* — Ross J Christie
(74) *Attorney, Agent, or Firm* — Faegre Drinker Biddle & Reath LLP

(57) ABSTRACT

A cutting tool includes: a substrate including a rake face; and a coating film that coats the rake face, wherein the coating film includes an $\alpha$-$Al_2O_3$ layer disposed on the substrate, the $\alpha$-$Al_2O_3$ layer includes crystal grains of $\alpha$-$Al_2O_3$, an area ratio of crystal grains oriented in (001) among the crystal grains is 50% to 90% in the $\alpha$-$Al_2O_3$ layer at the rake face, and a film residual stress $A_A$ determined based on a crystal plane interval of a (001) plane of the $\alpha$-$Al_2O_3$ layer at the rake face is more than 0 MPa and less than or equal to 2000 MPa, and a film residual stress $B_A$ determined based on a
(Continued)

crystal plane interval of a (110) plane of the $\alpha$-$Al_2O_3$ layer at the rake face is more than or equal to −1000 MPa and less than 0 MPa.

5 Claims, 6 Drawing Sheets

(51) Int. Cl.
*B23C 5/16* (2006.01)
*C23C 28/04* (2006.01)
*C23C 28/00* (2006.01)

(56) References Cited

U.S. PATENT DOCUMENTS

| | | |
|---|---|---|
| 2009/0017289 A1 | 1/2009 | Zackrisson et al. |
| 2012/0282049 A1 | 11/2012 | Okada et al. |
| 2014/0377024 A1 | 12/2014 | Sobana et al. |
| 2016/0332237 A1* | 11/2016 | Nakamura ............... C23C 16/36 |
| 2017/0190591 A1 | 7/2017 | Imamura et al. |
| 2017/0191169 A1 | 7/2017 | Imamura et al. |
| 2017/0259344 A1 | 9/2017 | Detani et al. |
| 2018/0216224 A1* | 8/2018 | Stiens ............... C23C 16/34 |
| 2019/0003060 A1* | 1/2019 | Okude ............... C23C 16/32 |

FOREIGN PATENT DOCUMENTS

| | | | |
|---|---|---|---|
| JP | 2004-284003 A | | 10/2004 |
| JP | 2009-28894 A | | 2/2009 |
| JP | 2010-207946 A | | 9/2010 |
| JP | 2013-132717 A | | 7/2013 |
| JP | 2016-165789 A | | 9/2016 |
| JP | 2017-13223 A | | 1/2017 |
| JP | 2017042901 A | * | 3/2017 |
| JP | 2017-177292 A | | 10/2017 |
| WO | WO-2012/063515 A1 | | 5/2012 |

OTHER PUBLICATIONS

Notice of Allowance dated Apr. 28, 2021 that issued in U.S. Appl. No. 16/637,019.

Office Action dated Mar. 1, 2021 that issued in U.S. Appl. No. 16/637,019.

Office Action dated Dec. 7, 2020 that issued in U.S. Appl. No. 16/637,019.

* cited by examiner

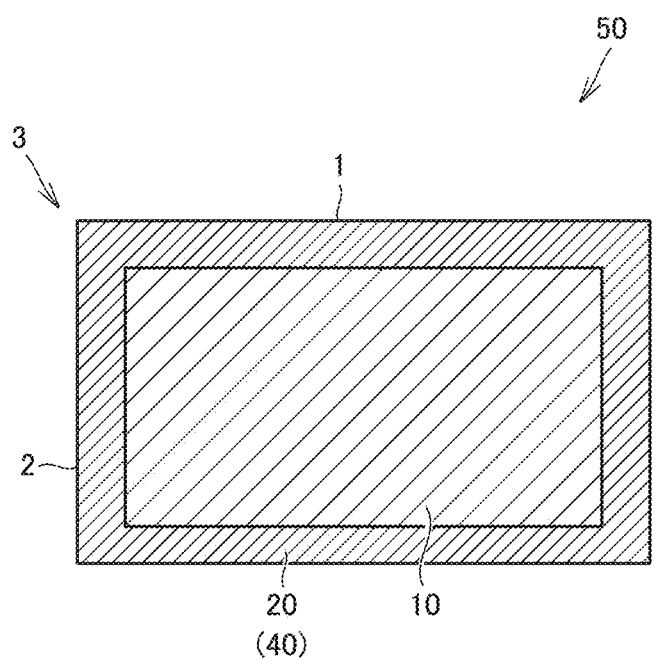

US 11,167,355 B2

CUTTING TOOL

TECHNICAL FIELD

The present disclosure relates to a cutting tool. The present application claims a priority based on Japanese Patent Application No. 2018-194134 filed on Oct. 15, 2018, the entire content of which is incorporated herein by reference.

BACKGROUND ART

Conventionally, a cutting tool having a substrate coated with a coating film has been used. For example, Japanese Patent Laying-Open No. 2004-284003 (Patent Literature 1) discloses a surface-coated cutting tool having a coating film including an $\alpha$-$Al_2O_3$ layer in which a total area of crystal grains exhibiting a crystal orientation of a (0001) plane is more than or equal to 70% when seen in a plan view in the normal direction of a surface of the layer.

Moreover, Japanese Patent Laying-Open No. 2009-028894 (Patent Literature 2) discloses a coated cutting tool having a cemented carbide body and a coating, wherein at least an outermost layer of the coating is an $\alpha$-$Al_2O_3$ layer that has a thickness of 7 to 12 μm and that is oriented in a (006) direction, an orientation coefficient TC (006) thereof is more than 2 and less than 6, each of orientation coefficients TC (012), TC (110), TC (113), TC (202), TC (024) and TC (116) is less than 1, and an orientation coefficient TC (104) is the second largest orientation coefficient.

CITATION LIST

Patent Literature

PTL 1: Japanese Patent Laying-Open No. 2004-284003
PTL 2: Japanese Patent Laying-Open No. 2009-028894

SUMMARY OF INVENTION

A cutting tool according to the present disclosure is a cutting tool including: a substrate including a rake face; and a coating film that coats the rake face, wherein
the coating film includes an $\alpha$-$Al_2O_3$ layer disposed on the substrate,
the $\alpha$-$Al_2O_3$ layer includes crystal grains of $\alpha$-$Al_2O_3$,
an area ratio of crystal grains oriented in (001) among the crystal grains is more than or equal to 50% and less than or equal to 90% in the $\alpha$-$Al_2O_3$ layer at the rake face, and
in a residual stress measurement performed in accordance with a 2θ-$sin^2\psi$ method using X rays,
a film residual stress $A_A$ determined based on a crystal plane interval of a (001) plane of the $\alpha$-$Al_2O_3$ layer at the rake face is more than 0 MPa and less than or equal to 2000 MPa, and
a film residual stress $B_A$ determined based on a crystal plane interval of a (110) plane of the $\alpha$-$Al_2O_3$ layer at the rake face is more than or equal to −1000 MPa and less than 0 MPa.

BRIEF DESCRIPTION OF DRAWINGS

FIG. 6 is a schematic cross sectional view of the cutting tool according to the present embodiment.

DETAILED DESCRIPTION

Figure 1:
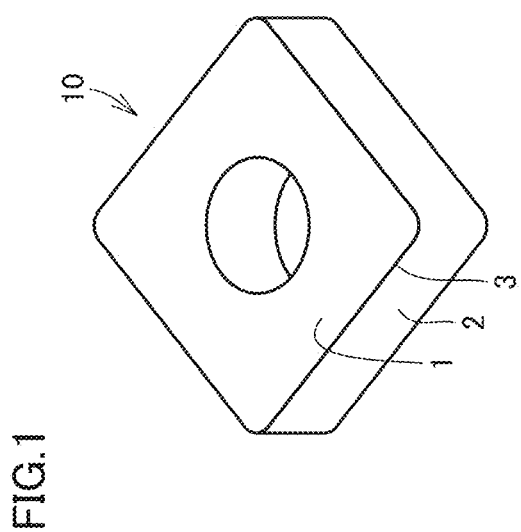
FIG. 1 is a perspective view illustrating one embodiment of a substrate of a cutting tool.

Problem to be Solved by the Present Disclosure

In each of Patent Literature 1 and Patent Literature 2, since the coating film having the $\alpha$-$Al_2O_3$ layer configured as described above is included, mechanical characteristics of the surface-coated cutting tool, such as wear resistance (for example, crater wear resistance or the like) and breakage resistance, are improved, with the result that the life of the cutting tool is expected to be long.

However, in recent years, cutting has been performed at a higher speed with higher efficiency. This leads to an increased load imposed on a cutting tool, with the result that the life of the cutting tool tends to be short. Accordingly, it has been required to further improve mechanical characteristics of a coating film of a cutting tool.

The present disclosure has been made in view of the above-described circumstances, and has an object to provide a cutting tool excellent in chipping resistance and crater wear resistance.

Advantageous Effect of the Present Disclosure

According to the present disclosure, a cutting tool excellent in chipping resistance and crater wear resistance can be provided.

DESCRIPTION OF EMBODIMENTS

First, embodiments of the present disclosure are listed and described.

[1] A cutting tool according to the present disclosure is a cutting tool including: a substrate including a rake face; and a coating film that coats the rake face, wherein
the coating film includes an $\alpha$-$Al_2O_3$ layer disposed on the substrate,
the $\alpha$-$Al_2O_3$ layer includes crystal grains of $\alpha$-$Al_2O_3$,
an area ratio of crystal grains oriented in (001) among the crystal grains is more than or equal to 50% and less than or equal to 90% in the $\alpha$-$Al_2O_3$ layer at the rake face, and
in a residual stress measurement performed in accordance with a 2θ-$sin^2\psi$ method using X rays,
a film residual stress $A_A$ determined based on a crystal plane interval of a (001) plane of the $\alpha$-$Al_2O_3$ layer at the rake face is more than 0 MPa and less than or equal to 2000 MPa, and
a film residual stress $B_A$ determined based on a crystal plane interval of a (110) plane of the $\alpha$-$Al_2O_3$ layer at the rake face is more than or equal to −1000 MPa and less than 0 MPa.

Since the cutting tool is configured as described above, the cutting tool can have an excellent chipping resistance and an excellent crater wear resistance. Here, the term "chipping resistance" refers to a characteristic of suppressing breakage or detachment of only a surface layer of the coating film.

[2] The α-Al$_2$O$_3$ layer has a thickness of more than or equal to 1 μm and less than or equal to 20 μm, in a residual stress measurement performed in accordance with a constant penetration depth method using X rays at a region r1 interposed between a virtual plane D1 and a virtual plane D2, the virtual plane D1 being located at a distance d$_{10}$ from a surface of the α-Al$_2$O$_3$ layer opposite to the substrate toward the substrate side, the distance d$_{10}$ being 10% of the thickness of the α-Al$_2$O$_3$ layer, the virtual plane D2 being located at a distance d$_{40}$ from the surface of the α-Al$_2$O$_3$ layer opposite to the substrate toward the substrate side, the distance d$_{40}$ being 40% of the thickness of the α-Al$_2$O$_3$ layer, a residual stress A determined based on the crystal plane interval of the (001) plane of the α-Al$_2$O$_3$ layer at the rake face is more than or equal to −200 MPa and less than or equal to 2000 MPa, and a residual stress B determined based on the crystal plane interval of the (110) plane of the α-Al$_2$O$_3$ layer at the rake face is more than or equal to −1500 MPa and less than or equal to 700 MPa, and a relational expression of A>B is satisfied. By defining in this way, a cutting tool more excellent in chipping resistance can be provided.

[3] A stress distribution of the residual stress A has a first a region in which the residual stress A is decreased continuously from the surface of the α-Al$_2$O$_3$ layer opposite to the substrate toward the substrate side, and a second a region which is located at the substrate side relative to the first a region and in which the residual stress A is increased continuously from the surface opposite to the substrate toward the substrate side, and the first a region and the second a region are continuous to each other via a minimum point of the residual stress A. By defining in this way, a cutting tool more excellent in crater wear resistance can be provided.

[4] A stress distribution of the residual stress B has a first b region in which the residual stress B is decreased continuously from the surface of the α-Al$_2$O$_3$ layer opposite to the substrate toward the substrate side, and a second b region which is located at the substrate side relative to the first b region and in which the residual stress B is increased continuously from the surface opposite to the substrate toward the substrate side, and the first b region and the second b region are continuous to each other via a minimum point of the residual stress B. By defining in this way, a cutting tool more excellent in crater wear resistance can be provided.

[5] The coating film further includes one or more intermediate layers disposed between the substrate and the α-Al$_2$O$_3$ layer, and each of the intermediate layers includes a compound that is composed of at least one element selected from a group consisting of a group 4 element, a group 5 element, a group 6 element in a periodic table, Al and Si, and at least one element selected from a group consisting of C, N, B, and O. By defining in this way, a cutting tool more excellent in chipping resistance and crater wear resistance can be provided.

DETAILS OF EMBODIMENTS OF THE PRESENT DISCLOSURE

The following describes one embodiment (hereinafter, referred to as "the present embodiment") of the present disclosure. However, the present embodiment is not limited thereto. In the present specification, the expression "X to Y" represents a range of lower to upper limits (i.e., more than or equal to X and less than or equal to Y). When no unit is indicated for X and a unit is indicated only for Y, the unit of X is the same as the unit of Y. Further, in the present specification, when a compound is expressed by a chemical formula in which a composition ratio of composition elements is not limited such as "TiC", it is assumed that the chemical formula includes all the conventionally known composition ratios (element ratios). In this case, it is assumed that the above-described chemical formula includes not only a stoichiometric composition but also a non-stoichiometric composition. For example, the chemical formula "TiC" includes not only a stoichiometric composition "Ti$_1$C$_1$" but also a non-stoichiometric composition such as "Ti$_1$C$_{0.8}$". The same also applies to compounds other than the "TiC".

<<Cutting Tool>>

A cutting tool according to the present disclosure is a cutting tool including: a substrate including a rake face; and a coating film that coats the rake face, wherein the coating film includes an α-Al$_2$O$_3$ layer disposed on the substrate, the α-Al$_2$O$_3$ layer includes crystal grains of α-Al$_2$O$_3$, an area ratio of crystal grains oriented in (001) among the crystal grains is more than or equal to 50% and less than or equal to 90% in the α-Al$_2$O$_3$ layer at the rake face, and in a residual stress measurement performed in accordance with a 2θ-sin$^2$ψ method using X rays, a film residual stress A$_A$ determined based on a crystal plane interval of a (001) plane of the α-Al$_2$O$_3$ layer at the rake face is more than 0 MPa and less than or equal to 2000 MPa, and a film residual stress B$_A$ determined based on a crystal plane interval of a (110) plane of the α-Al$_2$O$_3$ layer at the rake face is more than or equal to −1000 MPa and less than 0 MPa.

The surface-coated cutting tool (hereinafter, also simply referred to as "cutting tool") of the present embodiment includes the substrate having the rake face, and the coating film that coats the rake face. In another aspect of the present embodiment, the coating film may coat a portion (for example, a flank face) of the substrate other than the rake face. Examples of the above-described cutting tool include a drill, an end mill, an indexable cutting insert for drill, an indexable cutting insert for end mill, an indexable cutting insert for milling, an indexable cutting insert for turning, a metal saw, a gear cutting tool, a reamer, a tap, and the like.

<Substrate>

For the substrate of the present embodiment, any conventionally known substrate for such a purpose of use can be used. For example, the substrate preferably includes at least one selected from a group consisting of: a cemented carbide (for example, a tungsten carbide (WC) based cemented carbide, a cemented carbide including Co in addition to WC, or a cemented carbide having a carbonitride of Cr, Ti, Ta, Nb, or the like added therein in addition to WC); a cermet (including TiC, TiN, TiCN, or the like as a main component); a high-speed steel; a ceramic (titanium carbide, silicon carbide, silicon nitride, aluminum nitride, aluminum oxide, or the like); a cubic boron nitride sintered material (cBN sintered material); and a diamond sintered material. The substrate more preferably includes at least one selected from a group consisting of the cemented carbide, the cermet, and the cBN sintered material.

Among these various substrates, it is particularly preferable to select the WC based cemented carbide or the cBN sintered material. This is due to the following reason: each of these substrates is excellent in balance between hardness and strength particularly at a high temperature, and has an excellent characteristic as a substrate of a cutting tool for the above-described purpose of use.

When the cemented carbide is used as the substrate, the effects of the present embodiment are achieved even if the cemented carbide includes free carbon or an abnormal phase called phase in the structure thereof. It should be noted that the substrate used in the present embodiment may have a modified surface. For example, in the case of the cemented carbide, a β-free layer may be formed on the surface. In the case of the cBN sintered material, a surface hardening layer may be formed. Even when the surface is thus modified, the effects of the present embodiment are exhibited.

FIG. 1 is a perspective view illustrating one embodiment of the substrate of the cutting tool. The substrate having such a shape is used as a substrate of an indexable cutting insert for turning, for example. Substrate 10 has a rake face 1, a flank face 2, and a cutting edge ridgeline portion 3 at which rake face 1 and flank face 2 cross each other. That is, rake face 1 and flank face 2 are surfaces connected to each other with cutting edge ridgeline portion 3 being interposed therebetween. Cutting edge ridgeline portion 3 constitutes a cutting edge tip portion of substrate 10. The shape of such a substrate 10 can also be regarded as the shape of the above-described cutting tool.

When the cutting tool is an indexable cutting insert, a substrate 10 having a chip breaker or a substrate 10 having no chip breaker may be included. The shape of cutting edge ridgeline portion 3 includes any of a sharp edge (a ridge where the rake face and the flank face cross each other), a honed edge (a sharp edge processed to be rounded), a negative land (beveled), and a combination of the honed edge and the negative land.

In the description above, the shape of substrate 10 and the respective names of the portions thereof have been described with reference to FIG. 1. The same terms as those described above will be used for shape and names of portions corresponding to substrate 10 in the cutting tool according to the present embodiment. That is, cutting tool 50 described above has rake face 1, flank face 2, and cutting edge ridgeline portion 3 that connects rake face 1 and flank face 2 to each other (see FIG. 6).

<Coating Film>

A coating film 40 according to the present embodiment includes an $\alpha$-$Al_2O_3$ layer 20 provided on substrate 10 (see FIG. 6). The "coating film" has a function of improving various characteristics in the cutting tool such as chipping resistance and wear resistance by coating at least a portion (for example, a portion to be brought into contact with a workpiece during cutting) of the rake face. The coating film is not limited to coat a portion of the rake face, and preferably coats the entire surface of the rake face. The coating film may coat the entire surface of the substrate. However, a coating film that does not coat a portion of the rake face and a coating film having a partially different configuration are not deviated from the scope of the present embodiment.

The thickness of the coating film is preferably more than or equal to 3 μm and less than or equal to 50 μm, and is more preferably more than or equal to 5 μm and less than or equal to 25 μm. Here, the thickness of the coating film refers to a total of respective thicknesses of layers included in the coating film. Examples of the "layers included in the coating film" include an $\alpha$-$Al_2O_3$ layer, an intermediate layer, an underlying layer, an outermost layer, and the like, which are described below. The thickness of the coating film can be determined, for example, as follows: a scanning transmission electron microscope (STEM) is used to measure thicknesses at ten arbitrary points in a cross sectional sample parallel to the normal direction of the surface of the substrate, and the average value of the measured thicknesses at the ten points is determined. The same applies to respective measurements of thicknesses of the $\alpha$-$Al_2O_3$ layer, the intermediate layer, the underlying layer, and the outermost layer, which are described below. Examples of the scanning transmission electron microscope include JEM-2100F (trademark) provided by JEOL.

($\alpha$-$Al_2O_3$ Layer)

The $\alpha$-$Al_2O_3$ layer of the present embodiment includes crystal grains of $\alpha$-$Al_2O_3$ (aluminum oxide having an $\alpha$ type crystal structure) (hereinafter, also simply referred to as "crystal grains"). That is, the $\alpha$-$Al_2O_3$ layer is a layer including polycrystal $\alpha$-$Al_2O_3$.

The $\alpha$-$Al_2O_3$ layer may be provided directly on the substrate or may be provided on the substrate with another layer such as the below-described intermediate layer being interposed therebetween as long as the effects exhibited by the cutting tool according to the present embodiment are not compromised. On the $\alpha$-$Al_2O_3$ layer, another layer such as an outermost layer may be provided. Moreover, the $\alpha$-$Al_2O_3$ layer may be the outermost layer (outermost surface layer) of the coating film.

The $\alpha$-$Al_2O_3$ layer has the following features. That is, an area ratio of crystal grains oriented in (001) among the crystal grains is more than or equal to 50% and less than or equal to 90% in the $\alpha$-$Al_2O_3$ layer at the rake face. In another aspect of the present embodiment, an area ratio of crystal grains other than the crystal grains oriented in (001) is more than or equal to 10% and less than or equal to 50% at the rake face. Moreover, a total of the area ratio of the crystal grains oriented in (001) and the area ratio of the crystal grains other than the crystal grains oriented in (001) is 100%.

In still another aspect of the present embodiment, when a color map is prepared based on respective crystal orientations of the crystal grains specified from an electron backscatter diffraction image analysis performed using a field emission type scanning electron microscope onto a mirror-polished, processed surface of the $\alpha$-$Al_2O_3$ layer, the area ratio of the crystal grains oriented in (001) may be more than or equal to 50% and less than or equal to 90% in the color map. The processed surface of the $\alpha$-$Al_2O_3$ layer is parallel to the surface of the substrate at the rake face.

Since the area ratio of the crystal grains of $\alpha$-$Al_2O_3$ oriented in (001) in the $\alpha$-$Al_2O_3$ layer at the rake face is more than or equal to 50% and less than or equal to 90%, the $\alpha$-$Al_2O_3$ layer has a particular orientation ((001) orientation), whereby the cutting tool of the present embodiment can sufficiently obtain an effect of improving the strength of the coating film. Moreover, when the coating film coats the entire surface of the substrate, an area ratio of crystal grains oriented in (001) in the $\alpha$-$Al_2O_3$ layer at a surface of the substrate other than the rake face may be more than or equal to 50% and less than or equal to 90% or may have a value falling out of the range of more than or equal to 50% and less than or equal to 90% in the cutting tool of the present embodiment.

Here, the "crystal grains of $\alpha$-$Al_2O_3$ oriented in (001)" or the "crystal grains oriented in (001)" refer to crystal grains of $\alpha$-$Al_2O_3$ in each of which an inclination angle of the (001) plane (an angle formed between the normal line of a surface (facing the coating film) of the substrate and the normal line of the (001) plane) is 0 to 20° relative to the normal line of the surface of the substrate. Whether or not arbitrary crystal grains of $\alpha\text{-}Al_2O_3$ are oriented in (001) in the $\alpha\text{-}Al_2O_3$ crystal layer can be confirmed using a field emission type scanning electron microscope (FE-SEM) including an electron backscatter diffraction apparatus (EBSD apparatus). The electron backscatter diffraction image analysis (EBSD image analysis) is an analysis method based on automatic analysis of a Kikuchi diffraction pattern generated by backscattered electrons. In addition, the "crystal grains other than the crystal grains of $\alpha\text{-}Al_2O_3$ oriented in (001)" or the "crystal grains other than the crystal grains oriented in (001)" refer to crystal grains of $\alpha\text{-}Al_2O_3$ in each of which the inclination angle of the (001) plane is more than 20° relative to the normal line of the surface of the substrate.

For example, an FE-SEM including an EBSD apparatus is used to capture an image of the mirror-polished, processed surface of the $\alpha\text{-}Al_2O_3$ layer parallel to the surface of the substrate at the rake face. Next, an angle is calculated which is formed between the normal direction of the (001) plane of each pixel of the captured image and the normal direction of the surface of the substrate (i.e., the linear direction of the processed surface parallel to the thickness direction of the $\alpha\text{-}Al_2O_3$ layer). Then, pixels in each of which the angle is 0 to 20° are selected. Each of the selected pixels corresponds to a crystal grain of $\alpha\text{-}Al_2O_3$ in which the inclination angle of the (001) plane is 0 to 20° relative to the surface of the substrate, i.e., corresponds to the "crystal grain of $\alpha\text{-}Al_2O_3$ oriented in (001)".

The area ratio of the crystal grains of $\alpha\text{-}Al_2O_3$ oriented in (001) at a predetermined region (i.e., a color map) of the processed surface of the $\alpha\text{-}Al_2O_3$ layer is calculated based on the color map prepared by providing colors to the selected pixels for the purpose of classification for the processed surface of the $\alpha\text{-}Al_2O_3$ layer as crystal orientation mapping. In the crystal orientation mapping, predetermined colors are provided to the selected pixels. Hence, the area ratio of the crystal grains of $\alpha\text{-}Al_2O_3$ oriented in (001) at the predetermined region can be calculated using the provided colors as indices. The calculation of the formed angle, the selection of the pixels in each of which the angle is 0 to 20°, and the calculation of the area ratio can be performed using commercially available software (trademark: "Orientation Imaging Microscopy Ver 6.2" provided by EDAX), for example.

Figure 2:
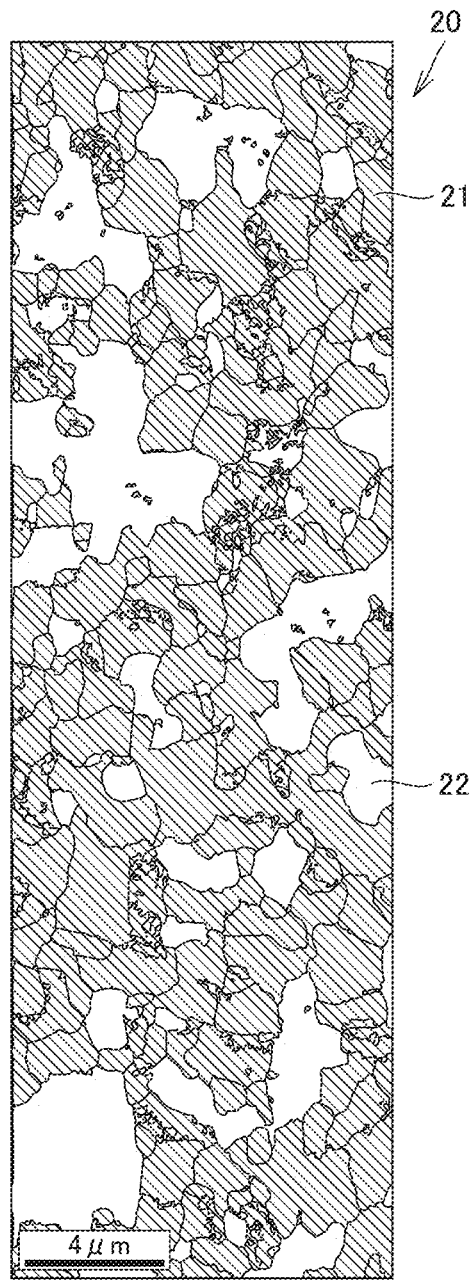
FIG. 2 shows an exemplary color map in a processed surface of an $\alpha$-$Al_2O_3$ layer.

FIG. 2 shows an exemplary color map for the above-described processed surface of $\alpha\text{-}Al_2O_3$ layer 20. In FIG. 2, crystal grains 21 oriented in (001) are represented by regions that are surrounded by solid lines and that are indicated by left oblique hatchings, and crystal grains 22 other than the crystal grains oriented in (001) are represented by regions that are surrounded by solid lines and that are indicated by a white color. That is, in the color map illustrated in FIG. 2, the left oblique hatchings represent the crystal grains in each of which the angle of the normal direction of the (001) plane relative to the normal direction of the surface of $\alpha\text{-}Al_2O_3$ layer 20 is 0 to 20°. Moreover, the white color represents the crystal grains in each of which the angle of the normal direction of the (001) plane relative to the normal direction of the surface of $\alpha\text{-}Al_2O_3$ layer 20 is more than 20°.

From the crystal orientation mapping (color map), in the present embodiment, it is specified that the processed surface of the $\alpha\text{-}Al_2O_3$ layer includes a portion in which the area ratio of the crystal grains of $\alpha\text{-}Al_2O_3$ oriented in (001) is more than or equal to 50% and less than or equal to 90%. The area ratio of the crystal grains of $\alpha\text{-}Al_2O_3$ oriented in (001) is preferably more than or equal to 50% and less than or equal to 90%, and is more preferably more than or equal to 55% and less than or equal to 85%.

It should be noted that for the calculation of the area ratio of the crystal grains of $\alpha\text{-}Al_2O_3$ oriented in (001), an observation magnification of the FE-SEM is set to 5000×. Moreover, an observed area is set to 450 μm² (30 μm×15 μm). The number of measurement fields is set to more than or equal to 3.

The thickness of the $\alpha\text{-}Al_2O_3$ layer is preferably more than or equal to 1 μm and less than or equal to 20 μm, and is more preferably more than or equal to 4 μm and less than or equal to 15 μm.

(Residual Stress of $\alpha\text{-}Al_2O_3$ Layer)
(Film Residual Stress by $2\theta\text{-}\sin^2\psi$ Method)

In the $\alpha\text{-}Al_2O_3$ layer in the present embodiment, in a residual stress measurement performed in accordance with a $2\theta\text{-}\sin^2\psi$ method using X rays, a film residual stress $A_A$ determined based on a crystal plane interval of a (001) plane of the $\alpha\text{-}Al_2O_3$ layer at the rake face is more than 0 MPa and less than or equal to 2000 MPa, and a film residual stress $B_A$ determined based on a crystal plane interval of a (110) plane of the $\alpha\text{-}Al_2O_3$ layer at the rake face is more than or equal to −1000 MPa and less than 0 MPa.

Here, the "residual stress" refers to one type of internal stress (inherent strain) in a layer. The residual stress is divided roughly into a compressive residual stress and a tensile residual stress. The compressive residual stress refers to a residual stress represented by a numerical value with a negative sign "−" (minus) (indicated by "MPa" as a unit in the present specification). For example, it can be understood that a "compressive residual stress of 100 MPa" is a residual stress of −100 MPa. Hence, a concept "large compressive residual stress" indicates that the absolute value of the above-described numerical value is large, and a concept "small compressive residual stress" indicates that the absolute value of the above-described numerical value is small.

The tensile residual stress refers to a residual stress represented by a numerical value with a positive sign "+" (plus) (indicated by "MPa" as a unit in the present specification). For example, it can be understood that a "tensile residual stress of 100 MPa" is a residual stress of 100 MPa. Hence, a concept "large tensile residual stress" indicates that the above-described numerical value is large, and a concept "small tensile residual stress" indicates that the numerical value is small.

In the present embodiment, the expression "film residual stress $A_A$ determined based on the crystal plane interval of the (001) plane at the rake face" refers to a residual stress that reflects a whole of a predetermined measurement visual field at the rake face and that is calculated based on the crystal plane interval of the (001) plane in the whole of the predetermined measurement visual field. Film residual stress $A_A$ is calculated by the residual stress measurement performed in accordance with the $2\theta\text{-}\sin^2\psi$ method using X rays. A specific method thereof is as follows. First, for the whole of the measurement visual field, the crystal plane interval of the (001) plane is measured in accordance with the $2\theta\text{-}\sin^2\psi$ method. Here, for an angle of diffraction during the measurement, an angle of diffraction corresponding to a crystal plane to be measured is designated. The measurement visual field described above refers to a "measurement visual field at the surface of the $\alpha\text{-}Al_2O_3$ layer". Next, based on the measured crystal plane interval of the (001) plane, the residual stress of the whole of the measurement visual field is calculated. Such measurement is performed at a plurality of measurement visual fields, and the average value of respective residual stresses calculated in the measurement visual fields is regarded as "film residual stress $A_A$".

When the area ratio of the crystal grains oriented in (001) is more than or equal to 50%, it is considered that residual stresses included in the crystal grains oriented in (001) greatly contribute to film residual stress $A_A$. Due to such a reason, the present inventors consider that film residual stress $A_A$ can be regarded as the residual stresses included in the crystal grains oriented in (001).

In the present embodiment, the residual stress is measured in accordance with the $2\theta\text{-}\sin^2\psi$ method under the following conditions.

Apparatus: SmartLab (provided by Rigaku)
X-ray: Cu/Kα/45 kV/200 mA
Counter: D/teX Ultra250 (provided by Rigaku)
Scanning range: 89.9° to 91.4° (inclination method) in the case of film residual stress $A_A$
37.0° to 38.4° (inclination method) in the case of film residual stress $B_A$ In the present embodiment, the expression "film residual stress $B_A$ determined based on the crystal plane interval of the (110) plane at the rake face" refers to a residual stress that reflects a whole of a predetermined measurement visual field at the rake face and that is calculated based on the crystal plane interval of the (110) plane in the whole of the predetermined measurement visual field. Film residual stress $B_A$ is calculated by the residual stress measurement performed in accordance with the $2\theta\text{-}\sin^2\psi$ method using X rays. A specific method thereof is as follows. First, for the whole of the measurement visual field, the crystal plane interval of the (110) plane is measured in accordance with the $2\theta\text{-}\sin^2\psi$ method. Here, the measurement visual field described above refers to a "measurement visual field at the surface of the α-Al$_2$O$_3$ layer". Next, based on the measured crystal plane interval of the (110) plane, the residual stress of the whole of the measurement visual field is calculated. Such measurement is performed at a plurality of measurement visual fields, and the average value of respective residual stresses calculated in the measurement visual fields is regarded as "film residual stress $B_A$".

Film residual stress $B_A$ tends to exhibit a higher compressive residual stress value than that of film residual stress $A_A$. Due to such a reason, the present inventors consider that the residual stresses included in the crystal grains other than the crystal grains oriented in (001) greatly contribute to film residual stress $B_A$ as compared with film residual stress $A_A$.

(Residual Stress of α-Al$_2$O$_3$ Layer in Depth Direction)
(Residual Stress by Constant Penetration Depth Method)

Figure 3:
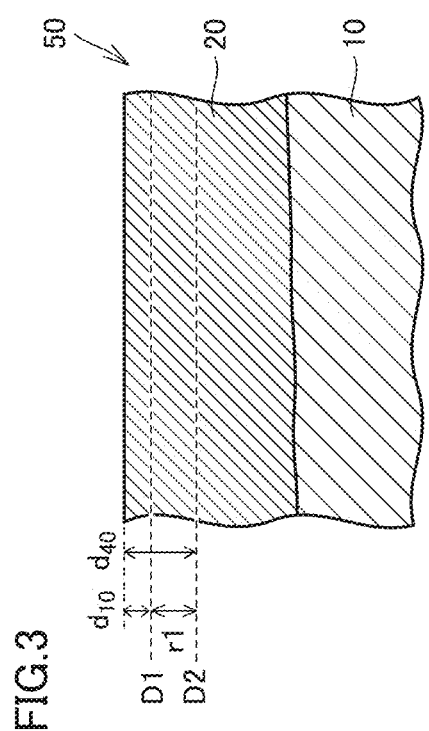
FIG. 3 is a schematic cross sectional view showing a region in a thickness direction of the $\alpha$-$Al_2O_3$ layer.

Preferably, in the present embodiment, in a residual stress measurement performed in accordance with a constant penetration depth method using X rays at a region r1 interposed between a virtual plane D1 and a virtual plane D2, the virtual plane D1 being located at a distance $d_{10}$ from a surface of the α-Al$_2$O$_3$ layer opposite to the substrate toward the substrate side, the distance $d_{10}$ being 10% of the thickness of the α-Al$_2$O$_3$ layer, the virtual plane D2 being located at a distance $d_{40}$ from the surface of the α-Al$_2$O$_3$ layer opposite to the substrate toward the substrate side, the distance $d_{40}$ being 40% of the thickness of the α-Al$_2$O$_3$ layer, a residual stress A determined based on the crystal plane interval of the (001) plane of the α-Al$_2$O$_3$ layer at the rake face is more than or equal to −200 MPa and less than or equal to 2000 MPa, and
a residual stress B determined based on the crystal plane interval of the (110) plane of the α-Al$_2$O$_3$ layer at the rake face is more than or equal to −1500 MPa and less than or equal to 700 MPa, and
a relational expression of A>B is satisfied (for example, FIG. 3).

Preferably, in another aspect of the present embodiment, the α-Al$_2$O$_3$ layer has a thickness of more than or equal to 1 μm and less than or equal to 20 μm, in a residual stress measurement performed in accordance with a constant penetration depth method using X rays at a region r1 interposed between a virtual plane D1 and a virtual plane D2, the virtual plane D1 being located at a distance $d_{10}$ from a surface of the α-Al$_2$O$_3$ layer opposite to the substrate toward the substrate side, the distance $d_{10}$ being 10% of the thickness of the α-Al$_2$O$_3$ layer, the virtual plane D2 being located at a distance $d_{40}$ from the surface of the α-Al$_2$O$_3$ layer opposite to the substrate toward the substrate side, the distance $d_{40}$ being 40% of the thickness of the α-Al$_2$O$_3$ layer, a residual stress A determined based on the crystal plane interval of the (001) plane of the α-Al$_2$O$_3$ layer at the rake face is more than or equal to −200 MPa and less than or equal to 2000 MPa, and
a residual stress B determined based on the crystal plane interval of the (110) plane of the α-Al$_2$O$_3$ layer at the rake face is more than or equal to −1500 MPa and less than or equal to 700 MPa, and
a relational expression of A>B is satisfied.

In the present embodiment, the expression "residual stress A determined based on the crystal plane interval of the (001) plane at the rake face" refers to a residual stress at a predetermined depth location of the rake face, the residual stress being calculated based on the crystal plane interval of the (001) plane. Residual stress A is calculated in accordance with the constant penetration depth method using X rays. A specific method thereof is as follows. First, for the whole of the measurement visual field, the crystal plane interval of the (001) plane at the predetermined depth location is measured in accordance with the constant penetration depth method. Here, the measurement visual field refers to a "measurement visual field at a virtual plane that is parallel to the surface of the α-Al$_2$O$_3$ layer and that passes through the predetermined depth location". Next, based on the measured crystal plane interval of the (001) plane, the residual stress of the whole of the measurement visual field is calculated. Such measurement is performed at a plurality of measurement visual fields, and the average value of respective residual stresses calculated in the measurement visual fields is regarded as "residual stress A".

In the present embodiment, the residual stress is measured in accordance with the constant penetration depth method under the following conditions.

Apparatus: Spring-8 BL16XU
X-ray energy: 10 keV (λ=0.124 nm)
X-ray beam diameter: 0.4 to 1.8 mm (changed depending on a penetration depth)
Used diffraction plane: (001) plane in the case of residual stress A
(110) plane in the case of residual stress B In the present embodiment, the expression "residual stress B determined based on the crystal plane interval of the (110) plane at the rake face" refers to a residual stress at a predetermined depth location of the rake face, the residual stress being calculated based on the crystal plane interval of the (110) plane. Residual stress B is calculated in accordance with the constant penetration depth method using X rays.

Whether or not residual stress A and residual stress B are residual stresses falling within respective predetermined numerical ranges at region r1 can be determined by measuring, in accordance with the constant penetration depth method using the X rays, residual stresses A ($A_{d10}$ and $A_{d40}$) and B ($B_{d10}$ and $B_{d40}$)) at the depth location of predetermined distance $d_{10}$ and the depth location of predetermined distance do in the $\alpha$-$Al_2O_3$ layer. Specifically, (1) first, residual stress $A_{d10}$ and residual stress $B_{d10}$ at a certain measurement visual field on virtual plane D1 are measured in accordance with the constant penetration depth method. (2) Next, the constant penetration depth method is also employed to measure residual stress $A_{d40}$ and residual stress $B_{d40}$ at a visual field located on virtual plane D2 just below the certain measurement visual field on the virtual plane D1 within the same region as the region in which the certain measurement visual field is located. (3) When measured residual stresses $A_{d10}$ and $A_{d40}$ and residual stresses $B_{d10}$ and $B_{d40}$ fall within the above-described respective numerical ranges and $A_{d10}>B_{d10}$ and $A_{d40}>B_{d40}$ are satisfied, it is determined that "residual stress A and residual stress B fall within the respective numerical ranges at region r1 and the relational expression of A>B is satisfied".

(Residual Stress Distribution of $\alpha$-$Al_2O_3$ Layer)

Preferably, in $\alpha$-$Al_2O_3$ layer 20 according to the present embodiment, a stress distribution of the residual stress A has
- a first a region in which the residual stress A is decreased continuously from the surface of the $\alpha$-$Al_2O_3$ layer opposite to the substrate toward the substrate side, and
- a second a region which is located at the substrate side relative to the first a region and in which the residual stress A is increased continuously from the surface opposite to the substrate toward the substrate side, and the first a region and the second a region are continuous to each other via a minimum point of the residual stress A.

Figure 4:
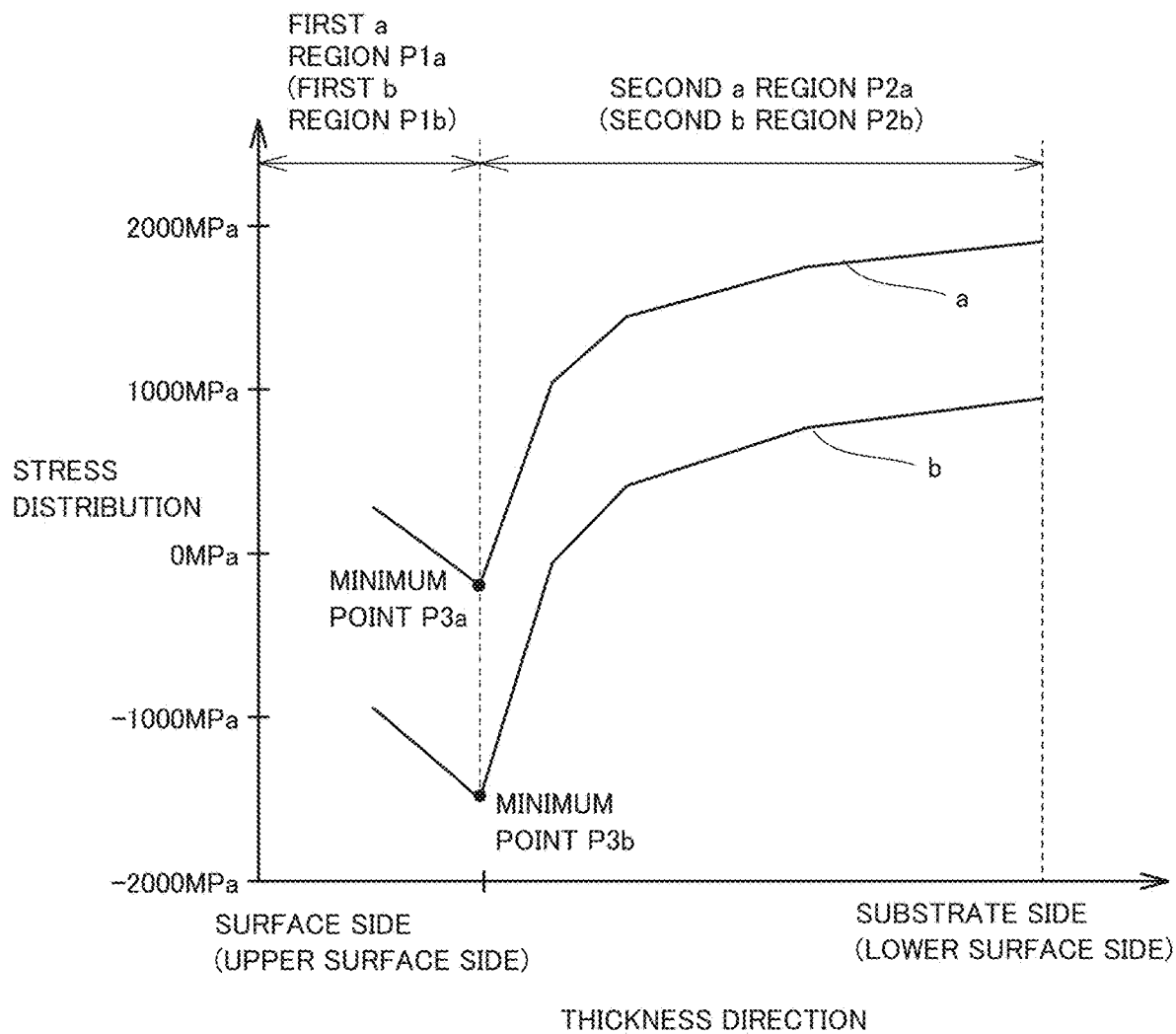
FIG. 4 is a graph schematically showing a stress distribution in the thickness direction of the $\alpha$-$Al_2O_3$ layer.

An exemplary stress distribution is shown in FIG. 4. In the graph of FIG. 4, the vertical axis represents a residual stress and the horizontal axis represents a location in the thickness direction of $\alpha$-$Al_2O_3$ layer 20. For the vertical axis, a negative value indicates that there is a compressive residual stress in $\alpha$-$Al_2O_3$ layer 20, a positive value indicates that there is a tensile residual stress in $\alpha$-$Al_2O_3$ layer 20, and a value of 0 indicates that there is no stress in $\alpha$-$Al_2O_3$ layer 20.

With reference to FIG. 4, for example, the stress distribution (curve a of FIG. 4) of residual stress A in the thickness direction of $\alpha$-$Al_2O_3$ layer 20 includes: a first a region P1a in which the value of the residual stress is decreased continuously from the upper surface side (the surface side or the surface side opposite to the substrate) toward the lower surface side (the substrate side); and a second a region P2a which is located at the lower surface side relative to the first a region and in which the value of the residual stress is increased continuously from the upper surface side toward the lower surface side. Here, the second a region has a point at which the residual stress is changed from the compressive residual stress to the tensile residual stress. The first a region and the second a region are preferably continuous to each other via a minimum point P3a at which the value of the residual stress becomes minimum. This minimum point P3a is located at a location close to the upper surface relative to the lower surface.

Since $\alpha$-$Al_2O_3$ layer 20 has the above-described stress distribution, a balance between the crater wear resistance and chipping resistance of $\alpha$-$Al_2O_3$ layer 20 becomes more excellent in intermittent cutting. This is due to the following reason: an impact applied to $\alpha$-$Al_2O_3$ layer 20 from the upper surface side of $\alpha$-$Al_2O_3$ layer 20 is absorbed sufficiently between the upper surface side and minimum point P3a, and a high crack progression resistance is exhibited at the lower surface side relative to minimum point P3a.

In the stress distribution of residual stress A, the value of the residual stress is preferably more than or equal to $-1000$ MPa and less than or equal to 2000 MPa. In other words, in the stress distribution of residual stress A, the absolute value of the compressive residual stress is preferably less than or equal to 1000 MPa (i.e., more than or equal to $-1000$ MPa and less than 0 MPa), and the absolute value of the tensile residual stress is preferably less than or equal to 2000 MPa (i.e., more than 0 MPa and less than or equal to 2000 MPa). In this case, both the chipping resistance and the crater wear resistance tend to be exhibited appropriately.

Moreover, minimum point P3a is preferably positioned to have a distance of 0.1 to 40% of the thickness of the $\alpha$-$Al_2O_3$ layer 20 from the surface (upper surface) opposite to the substrate. In this case, a damage form of $\alpha$-$Al_2O_3$ layer 20 becomes stable to suppress, for example, sudden chipping of the coating film, whereby variation in the life of the tool can be reduced. For example, when the thickness of $\alpha$-$Al_2O_3$ layer 20 is 1 to 20 μm, the location of minimum point P3a is preferably 0.1 to 8 μm from the surface opposite to the substrate. Moreover, the value of the residual stress at minimum point P3a is preferably $-300$ to 900 MPa, is more preferably $-200$ to 850 MPa, and is further preferably $-100$ to 750 MPa.

Preferably, in the present embodiment, a stress distribution of the residual stress B has
- a first b region in which the residual stress B is decreased continuously from the surface of the $\alpha$-$Al_2O_3$ layer opposite to the substrate toward the substrate side, and
- a second b region which is located at the substrate side relative to the first b region and in which the residual stress B is increased continuously from the surface opposite to the substrate toward the substrate side, and the first b region and the second b region are continuous to each other via a minimum point of the residual stress B.

In the stress distribution (curve b of FIG. 4) of residual stress B, the value of the residual stress is preferably more than or equal to $-2000$ MPa and less than or equal to 1000 MPa. In other words, in the stress distribution of residual stress B, the absolute value of the compressive residual stress is preferably less than or equal to 2000 MPa (i.e., more than or equal to $-2000$ MPa and less than 0 MPa), and the absolute value of the tensile residual stress is preferably less than or equal to 1000 MPa (i.e., more than 0 MPa and less than or equal to 1000 MPa). In this case, both the chipping resistance and the crater wear resistance tend to be exhibited appropriately.

Moreover, minimum point P3b is preferably positioned to have a distance of 0.1 to 40% of the thickness of the $\alpha$-$Al_2O_3$ layer 20 from the surface (upper surface) opposite to the substrate. In this case, a damage form of $\alpha$-$Al_2O_3$ layer 20 becomes stable to suppress, for example, sudden chipping of the coating film, whereby variation in the life of the tool can be reduced. For example, when the thickness of $\alpha$-$Al_2O_3$ layer 20 is 1 to 20 μm, the location of minimum point P3b is preferably 0.1 to 8 μm from the surface opposite to the substrate. Moreover, the value of the residual stress at minimum point P3b is preferably $-1900$ to $-100$ MPa, is more preferably $-1800$ to $-200$ MPa, and is further preferably $-1700$ to $-300$ MPa.

(Average Grain Size of Crystal Grains of $\alpha$-$Al_2O_3$)

In the present embodiment, the average grain size of the crystal grains of $\alpha$-$Al_2O_3$ is preferably 0.1 μm to 3 μm, and is more preferably 0.2 μm to 2 μm. For example, the average grain size of the crystal grains can be calculated using the above-described color map. Specifically, first, in the above-described color map, a region having the same color (i.e., the same plane orientation) and surrounded by different color(s) (i.e., different plane orientation(s)) is regarded as an individual region of each crystal grain. Next, a distance between two points on the outer circumference of each crystal grain is measured, and the longest distance between two points thereon is regarded as the grain size of the crystal grain.

(Intermediate Layer)

The coating film preferably further includes one or more intermediate layers disposed between the substrate and the α-$Al_2O_3$ layer. Each of the intermediate layers preferably includes a compound that is composed of at least one element selected from a group consisting of a group 4 element, a group 5 element, a group 6 element in a periodic table, Al and Si, and at least one element selected from a group consisting of C, N, B, and O. Examples of the group 4 element in the periodic table include titanium (Ti), zirconium (Zr), hafnium (Hf) and the like. Examples of the group 5 element in the periodic table include vanadium (V), niobium (Nb), tantalum (Ta) and the like. Examples of the group 6 element in the periodic table include chromium (Cr), molybdenum (Mo), tungsten (W) and the like. The intermediate layer more preferably includes a Ti compound composed of a Ti element and at least one element selected from a group consisting of C, N, B, and O.

Examples of the compound included in the intermediate layer includes TiCNO, TiAlN, TiAlSiN, TiCrSiN, TiAlCrSiN, AlCrN, AlCrO, AlCrSiN, TiZrN, TiAlMoN, TiAlNbN, TiSiN, AlCrTaN, AlTiVN, $TiB_2$, TiCrHfN, CrSiWN, TiAlCN, TiSiCN, AlZrON, AlCrCN, AlHfN, CrSiBON, TiAlWN, AlCrMoCN, TiAlBN, TiAlCrSiBCNO, ZrN, ZrCN and the like.

The thickness of the intermediate layer is preferably more than or equal to 0.1 μm and less than or equal to 3 and is more preferably more than or equal to 0.5 μm and less than or equal to 1.5 μm.

(Other Layer(s))

As long as the effects exhibited by the cutting tool according to the present embodiment are not compromised, the coating film may further include other layer(s). The other layer(s) may have a composition different from or the same as the composition of the α-$Al_2O_3$ layer or the intermediate layer. Examples of a compound included in the other layer(s) include TiN, TiCN, TiBN, $Al_2O_3$, and the like. It should be noted that an order of layering the other layer(s) is particularly not limited. Examples of the other layer(s) includes: an underlying layer provided between the substrate and the α-$Al_2O_3$ layer; an outermost layer provided on the α-$Al_2O_3$ layer; and the like. The thickness of each of the other layer(s) is not particularly limited as long as the effects of the present embodiment are not compromised. For example, the thickness of each of the other layer(s) is more than or equal to 0.1 μm and less than or equal to 20 μm.

<<Method for Manufacturing Cutting Tool>>

A method for manufacturing the cutting tool according to the present embodiment includes:

a step (hereinafter, also referred to as "first step") of preparing the substrate having the rake face;

a step (hereinafter, also referred to as "second step") of forming the coating film including the α-$Al_2O_3$ layer on the rake face of the substrate using a chemical vapor deposition method; and a step (hereinafter, also referred to as "third step") of performing a blasting process to the α-$Al_2O_3$ layer at the rake face.

<First Step: Step of Preparing Substrate>

In the first step, the substrate having the rake face is prepared. For example, a cemented carbide substrate is prepared as the substrate. For the cemented carbide substrate, a commercially available cemented carbide substrate may be used or a cemented carbide substrate may be produced using a general powder metallurgy method. In the production using the general powder metallurgy method, for example, WC powder, Co powder, and the like are mixed using a ball mill or the like to obtain a powder mixture. This powder mixture is dried and then is formed into a predetermined shape, thereby obtaining a shaped body. Further, by sintering the shaped body, a WC—Co based cemented carbide (sintered material) is obtained. Next, this sintered material is subjected to a predetermined cutting edge process such as honing, thereby producing a substrate composed of the WC—Co based cemented carbide. In the first step, any conventionally known substrate of this type other than the above-described substrate can be prepared.

<Second Step: Step of Forming Coating Film>

In the second step, the coating film including the α-$Al_2O_3$ layer is formed on the rake face of the substrate using the chemical vapor deposition method (CVD method).

Figure 5:
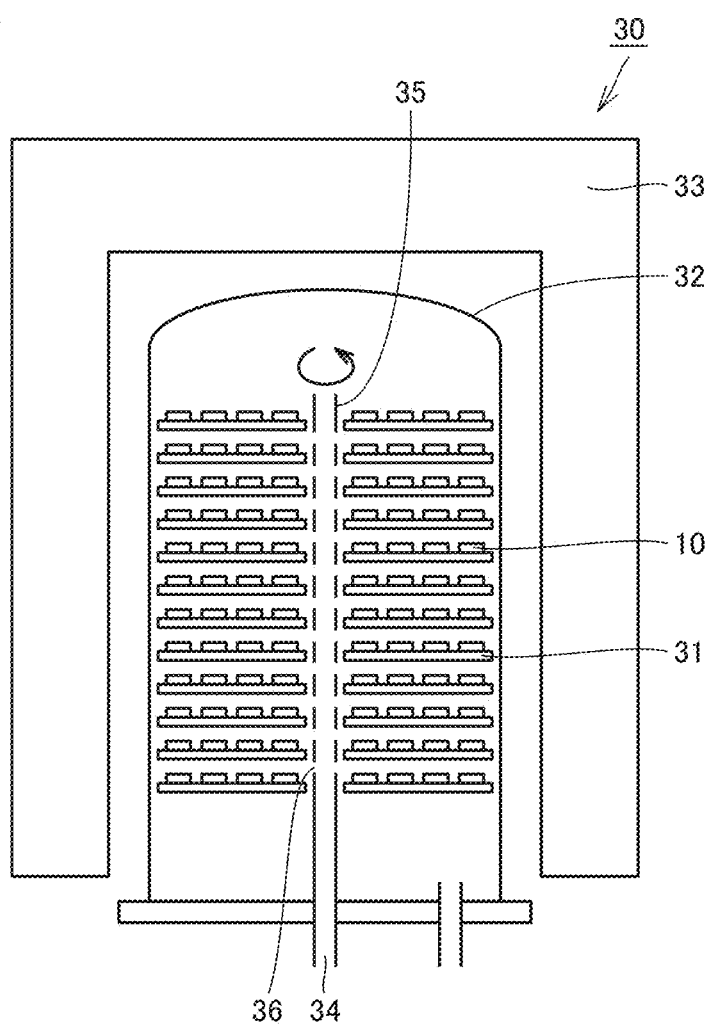
FIG. 5 is a schematic cross sectional view showing an exemplary chemical vapor deposition apparatus used to manufacture a coating film.

FIG. 5 is a schematic cross sectional view showing an exemplary chemical vapor deposition apparatus (CVD apparatus) used to manufacture the coating film. Hereinafter, the second step will be described with reference to FIG. 5. CVD apparatus 30 includes: a plurality of substrate setting jigs 31 for holding substrates 10; and a reaction container 32 that is composed of a heat-resistant alloy steel and that covers substrate setting jigs 31. Moreover, a temperature adjusting apparatus 33 for controlling a temperature in reaction container 32 is provided to surround reaction container 32. A gas inlet pipe 35 having a gas inlet 34 is provided in reaction container 32. Gas inlet pipe 35 is disposed to extend in the vertical direction and to be rotatable with respect to the vertical direction in an internal space of reaction container 32 in which substrate setting jigs 31 are disposed, and is provided with a plurality of jet holes 36 for jetting a gas into reaction container 32. By using this CVD apparatus 30, each of the layers of the coating film, inclusive of the α-$Al_2O_3$ layer, can be formed as follows.

First, each of substrates 10 is disposed on a substrate setting jig 31, and a source material gas for α-$Al_2O_3$ layer 20 is introduced from gas inlet pipe 35 into reaction container 32 while controlling the temperature and pressure in reaction container 32 to fall within predetermined ranges. Accordingly, α-$Al_2O_3$ layer 20 is formed on the rake face of substrate 10. Here, before forming the α-$Al_2O_3$ layer 20, it is preferable to form the intermediate layer on the surface of substrate 10 by introducing a source material gas for the intermediate layer from gas inlet pipe 35 into reaction container 32. The following describes a method for forming α-$Al_2O_3$ layer 20 after forming the intermediate layer on the surface of substrate 10.

Although the source material gas for the intermediate layer is not particularly limited, examples of the source material gas for the intermediate layer include: a mixed gas of $TiCl_4$ and $N_2$; a mixed gas of $TiCl_4$, $N_2$, and $CH_3CN$; and a mixed gas of $TiCl_4$, $N_2$, CO, and $CH_4$.

The temperature in reaction container 32 during the formation of the intermediate layer is preferably controlled to fall within a range of 1000 to 1100° C., and the pressure in reaction container 32 is preferably controlled to fall within a range of 0.1 to 1013 hPa. Moreover, HCl gas may be introduced together with the above-described source material gas. The introduction of HCl gas leads to improved uniformity of the thickness of each layer. It should be noted that it is preferable to use $H_2$ as a carrier gas. Moreover, when introducing a gas, it is preferable to rotate gas inlet pipe 35 by a driving unit not shown in the figure. Accordingly, in reaction container 32, each gas can be distributed uniformly.

Further, the intermediate layer may be formed using a MT (Medium Temperature)-CVD method. The MT-CVD method is a method for forming a layer by maintaining the temperature in reaction container 32 to a comparatively low temperature of 850 to 950° C., unlike a CVD method performed at a temperature of 1000 to 1100° C. (hereinafter, also referred to as "HT-CVD method"). Since the MT-CVD method is performed at the comparatively lower temperature than that in the HT-CVD method, damage to substrate 10 by heating can be reduced. Particularly, when the intermediate layer is a TiCN layer, it is preferable to form the intermediate layer using the MT-CVD method.

Next, $\alpha$-$Al_2O_3$ layer 20 is formed on the intermediate layer. As a source material gas, a mixed gas of $AlCl_3$, $N_2$, $CO_2$, and $H_2S$ is used. On this occasion, respective flow rates (L/min) of $CO_2$ and $H_2S$ are set to satisfy $CO_2/H_2S>2$. Accordingly, the $\alpha$-$Al_2O_3$ layer is formed. It should be noted that the upper limit value of $CO_2/H_2S$ is not particularly limited, but is preferably less than or equal to 5 in view of uniformity of the thickness of the layer. Moreover, the present inventors have confirmed that flow rates of $CO_2$ and $H_2S$ are preferably 0.4 to 2.0 L/min and 0.1 to 0.8 L/min, and are most preferably 1 L/min and 0.5 L/min, respectively.

The temperature in reaction container 32 is preferably controlled to fall within a range of 1000 to 1100° C., and the pressure in reaction container 32 is preferably controlled to fall within a range of 0.1 to 100 hPa. Moreover, HCl gas may be introduced together with the above-described source material gas, and $H_2$ can be used as a carrier gas. It should be noted that when introducing the gases, it is preferable to rotate gas inlet pipe 35 as with the foregoing case.

In order to more improve the effect of the present disclosure, it is preferable to decrease the temperature in the reaction container continuously at a rate (hereinafter, also referred to as "temperature decreasing rate") of 0.1 to 0.3° C./minute for a time (hereinafter, also referred to as "temperature decreasing time") of more than or equal to 30 minutes and less than 90 minutes, preferably more than or equal to 30 minutes and less than or equal to 80 minutes, at a final stage of the formation of the $\alpha$-$Al_2O_3$ layer. In this way, a tensile residual stress generated in the coating film becomes small, with the result that in the subsequent step of performing a blasting process, a tensile stress can be reduced and a compressive stress can be introduced more effectively.

It should be noted that an outermost layer may be formed on $\alpha$-$Al_2O_3$ layer 20 as long as the effects exhibited by the cutting tool according to the present embodiment are not compromised. A method for forming the outermost layer is not particularly limited. Examples thereof include a method for forming the outermost layer using the CVD method or the like.

Regarding the above-described manufacturing method, a configuration of each layer is changed by controlling conditions of the CVD method. For example, the composition of each layer is determined by the composition of the source material gas to be introduced into reaction container 32, and the thickness of each layer is controlled by an execution time (film formation time). Particularly, in order to decrease a ratio of coarse grains in $\alpha$-$Al_2O_3$ layer 20 and increase crystal grains oriented in the (001) plane, it is important to control a ratio ($CO_2/H_2S$) of the flow rates of the $CO_2$ gas and the $H_2S$ gas in the source material gas.

<Third Step: Step of Performing Blasting Process>

In the step of performing the blasting process, the $\alpha$-$Al_2O_3$ layer at the rake face is subjected to the blasting process. The "blasting process" refers to a process for changing various characteristics of the surface such as orientation and compressive stress by hitting (blasting with) a multiplicity of small spherical bodies (media) such as steel or nonferrous metal (for example, ceramic) against a surface such as the rake face at a high speed. In the present embodiment, the blasting process is performed onto the rake face to provide a residual stress to the $\alpha$-$Al_2O_3$ layer on the rake face, thus resulting in a difference between film residual stress $A_A$ and film residual stress $B_A$. As a result, crack progression in the $\alpha$-$Al_2O_3$ layer is suppressed, thereby attaining an excellent chipping resistance. The blasting with the media is not particularly limited as long as film residual stress $A_A$ and film residual stress $B_A$ in the $\alpha$-$Al_2O_3$ layer are provided to fall within the above-described respective predetermined numerical ranges. The blasting with the media may be performed directly onto the $\alpha$-$Al_2O_3$ layer or may be performed onto another layer (for example, the outermost layer) provided on the $\alpha$-$Al_2O_3$ layer. The blasting with the media is not particularly limited as long as the blasting with the media is performed at least onto the rake face. For example, the blasting with the media may be performed onto the entire surface of the cutting tool.

Conventionally, the blasting process has been performed to change, into a compressive stress, a tensile stress remaining mainly in a target layer in the coating film. However, it has not been conventionally known to perform the blasting process so as to bring the film residual stress (film residual stress $A_A$) of the crystal grains oriented in (001) and the film residual stress (film residual stress $B_A$) of the crystal grains other than the crystal grains oriented in (001) into the tensile residual stress and compressive residual stress falling within the predetermined numerical ranges, respectively. The present inventors have first found this.

Moreover, in the conventional blasting process, a blasting pressure is high and the coating film is polished at the same time. Accordingly, the conventional blasting process tends to involve breakage of the target layer due to the polishing of the coating film. In the present embodiment, the tensile residual stress generated in the $\alpha$-$Al_2O_3$ layer in the second step is smaller than that in the $\alpha$-$Al_2O_3$ layer formed in accordance with the conventional manufacturing method. Accordingly, breakage of the $\alpha$-$Al_2O_3$ layer does not take place and a stress is likely to be introduced into the $\alpha$-$Al_2O_3$ layer, with the result that film residual stress $A_A$ and film residual stress $B_A$ can become tensile residual stress and compressive residual stress falling within the predetermined numerical ranges, respectively.

Although a mechanism is not known as to a reason why film residual stress $A_A$ and film residual stress $B_A$ become the tensile residual stress and compressive residual stress falling within the predetermined numerical ranges respectively by performing the blasting process onto the $\alpha$-$Al_2O_3$ layer, the present inventors consider as follows. It is considered that the crystal grains oriented in (001) have a resistance against deformation due to external force because the crystal grains oriented in the same crystal orientation support one another. On the other hand, it is considered that the crystal grains other than the crystal grains oriented in (001) have a reduced resistance against the deformation due to external force because the crystal orientations thereof are not aligned. It is considered that since the crystal grains oriented in (001) and the other crystal grains are thus different from each other in terms of deformability with respect to external force, there occurs a difference therebetween in terms of residual stresses provided by the blasting process, with the result that film residual stress $A_A$ becomes the tensile residual stress and film residual stress $B_A$ becomes the compressive residual stress.

Examples of the material of the media include a steel, a ceramic, an aluminum oxide, a zirconium oxide, and the like.

The average grain size of the media is preferably 1 to 300 μm, and is more preferably 5 to 200 μm, for example.

For the media, a commercially available product may be used. Examples thereof include ceramic abrasive grains each having a grain size of 90 to 125 μm (average grain size of 100 μm) (provided by NICCHU; trademark: WAF120).

A distance (hereinafter, also referred to as "blasting distance") between a blasting unit for blasting with the media and the surface such as the rake face is preferably 80 mm to 120 mm, and is more preferably 80 mm to 100 mm.

A pressure (hereinafter, also referred to as "blasting pressure") to be applied to the media upon blasting is preferably 0.02 MPa to 0.5 MPa, and is more preferably 0.05 MPa to 0.3 MPa.

A process time for the blasting is preferably 5 seconds to 60 seconds, and is more preferably 10 seconds to 30 seconds.

The conditions of the blasting process can be appropriately adjusted in accordance with the configuration of the coating film.

<Other Step(s)>

In the manufacturing method according to the present embodiment, an additional step may be performed appropriately in addition to the steps described above, as long as the effects of the blasting process are not compromised.

EXAMPLES

While the present invention will be described in detail with reference to Examples, the present invention is not limited thereto.

<<Production of Cutting Tool>>
<First Step: Step of Preparing Substrate>

As substrates, cemented carbide cutting inserts (shape: CNMG120408N-UX; provided by Sumitomo Electric Industries HardMetal; JIS B4120 (2013)) were prepared each of which was composed of TaC (2.0 mass %), NbC (1.0 mass %), Co (10.0 mass %) and WC (remainder) (and included an inevitable impurity).

<Second Step: Step of Forming Coating Film>

A CVD apparatus was used to form an intermediate layer and an $\alpha\text{-Al}_2O_3$ layer in this order on each of the prepared substrates, thereby forming a coating film on a surface of the substrate including a rake face. Moreover, in parts of the samples, the $\alpha\text{-Al}_2O_3$ layer was directly foamed on the substrate without forming the intermediate layer (sample numbers 8 and 13). Conditions for forming each layer are described below. At a final stage of the formation of the $\alpha\text{-Al}_2O_3$ layer, a temperature was decreased at a temperature decreasing rate shown in Table 2 for a temperature decreasing time shown in Table 2. A cell with "-" in Table 2 means that a corresponding process was not performed. It should be noted that a value in parenthesis following each gas composition indicates a flow rate (L/min) of each gas. Moreover, the thickness of the $\alpha\text{-Al}_2O_3$ layer and the thickness and composition of the intermediate layer are shown in Table 1.

(Intermediate Layer)

Source material gas: $TiCl_4$ (0.002 L/min), $CH_4$ (2.0 L/min), CO (0.3 L/min), $N_2$ (6.5 L/min), HCl (1.8 L/min), $H_2$ (50 L/min)

Pressure: 160 hPa

Temperature: 1000° C.

Film formation time: 45 minutes ($\alpha\text{-Al}_2O_3$ Layer)

Source material gas: $AlCl_3$ (3.0 L/min), $CO_2$ (1.5 L/min), $H_2S$ (2.2 L/min), $H_2$ (40 L/min)

Pressure: 65 hPa

Temperature: 980 to 1000° C.

Temperature decreasing rate: as described in Table 2

Temperature decreasing time: as described in Table 2

Film formation time: 340 minutes

TABLE 1

| | $\alpha\text{-Al}_2O_3$ Layer | | | Intermediate Layer | |
|---|---|---|---|---|---|
| Sample Number | Area Ratio of Crystal Grains Oriented in (001) (%) | Area Ratio of Other Crystal Grains (%) * | Thickness (μm) | Composition | Thickness (μm) |
| 1 | 85 | 15 | 4.0 | TiCNO | 0.6 |
| 2 | 79 | 21 | 6.8 | TiCNO | 0.8 |
| 3 | 76 | 24 | 2.5 | TiCNO | 1.2 |
| 4 | 73 | 27 | 4 | TiCNO | 1 |
| 5 | 70 | 30 | 9.2 | TiCNO | 1.6 |
| 6 | 67 | 33 | 10.8 | TiCNO | 1.9 |
| 7 | 62 | 38 | 19.2 | TiCNO | 0.4 |
| 8 | 58 | 42 | 14.5 | — | — |
| 11 | 95 | 5 | 1.4 | TiCNO | 0.2 |
| 12 | 92 | 8 | 0.5 | TiCNO | 1.8 |
| 13 | 41 | 59 | 5.2 | — | — |

* means "the area ratio of the crystal grains other than the crystal grains oriented in (001)"

TABLE 2

| Sample Number | Conditions of Formation of α-Al₂O₃ Layer in Second Step | | Conditions of Blasting in Third Step |
|---|---|---|---|
| | Temperature Decreasing Rate (° C./Minute) | Temperature Decreasing Time (Minute) | Blasting Pressure (MPa) |
| 1 | 0.25 | 80 | 0.3 |
| 2 | 0.25 | 60 | 0.3 |
| 3 | 0.2 | 80 | 0.25 |
| 4 | 0.2 | 50 | 0.2 |
| 5 | 0.15 | 80 | 0.2 |
| 6 | 0.15 | 50 | 0.25 |
| 7 | 0.15 | 30 | 0.2 |
| 8 | 0.1 | 80 | 0.1 |
| 11 | 0.1 | 10 | 0.1 |
| 12 | 0.05 | 30 | 0.02 |
| 13 | — | — | — |

<Third Step: Step of Performing Blasting Process>

Next, the surface, inclusive of the rake face, of the cutting insert (cutting tool) having the coating film formed thereon was subjected to a blasting process under the following conditions. A cell with "–" in Table 2 means that a corresponding process was not performed.

(Blasting Conditions)
Abrasive grain concentration: 5 to 20 wt %
Blasting pressure: as described in Table 2
Blasting time: 5 to 20 seconds With the above procedure, cutting tools of sample numbers 1 to 8 (Examples) and sample numbers 11 to 13 (Comparative Example) were produced.

<<Evaluations on Characteristics of Cutting Tool>>

By using cutting tools of sample numbers 1 to 8 and sample numbers 11 to 13 produced as described above, characteristics of each of the cutting tools were evaluated as described below.

<Production of Color Map>

Mirror-polishing was performed to produce a processed surface of the α-Al₂O₃ layer so as to be parallel to the surface of the substrate at the rake face of the cutting tool having the coating film provided thereon. The produced processed surface was observed at a magnification of 5000× using an FE-SEM including an EBSD, thereby preparing the above-described color map for the processed surface with 30 μm×15 μm. The number of color maps prepared on this occasion (the number of measurement visual fields) was 3. For each color map, commercially available software (trademark: "Orientation Imaging Microscopy Ver 6.2" provided by EDAX) was used to calculate an area ratio of crystal grains of α-Al₂O₃ oriented in (001) and an area ratio of crystal grains other than the crystal grains of α-Al₂O₃ oriented in (001). Results thereof are shown in Table 1. Moreover, as apparent from Table 1, in each color map, a total of the area ratio of the crystal grains of α-Al₂O₃ oriented in (001) and the area ratio of the crystal grains other than the crystal grains of α-Al₂O₃ oriented in (001) with respect to the entire area of the color map was 100%.

<Measurement of Film Residual Stress by $2\theta\text{-}\sin^2\psi$ Method>

The above-described $2\theta\text{-}\sin^2\psi$ method was employed to measure film residual stress $A_A$ and film residual stress $B_A$ in the α-Al₂O₃ layer under the following conditions. Measured film residual stress $A_A$ and film residual stress $B_A$ are shown in Table 4. In Table 4, a residual stress indicated by a negative numerical value represents a compressive residual stress, whereas a residual stress indicated by a positive numerical value represents a tensile residual stress.

Apparatus: SmartLab (provided by Rigaku)
X-ray: Cu/Kα/45 kV/200 mA
Counter: D/teX Ultra250 (provided by Rigaku)
Scanning range: 89.9° to 91.4° (inclination method) in the case of film residual stress $A_A$
37.0° to 38.4° (inclination method) in the case of film residual stress $B_A$ <Measurement of Residual Stress by Constant Penetration Depth Method>

Further, the constant penetration depth method was employed to measure residual stress A and residual stress B at predetermined depth locations in the α-Al₂O₃ layer under the following conditions. Table 3 shows residual stresses A ($A_{d10}$, $A_{d40}$) and B ($B_{d10}$, $B_{d40}$) at representative depth locations. In accordance with results of measurement of residual stresses A and B, it was confirmed whether or not first a region P1a and second a region P2a (first b region P1b and second b region P2b) existed in each sample. Moreover, for each of samples confirmed to have first b region P1b and second b region P2b, minimum point P3b was determined to exist therein (Table 3).

Apparatus: Spring-8 BL16XU
X-ray energy: 10 keV (λ=0.124 nm)
X-ray beam diameter: 0.4 to 1.8 mm (changed depending on penetration depth)
Used diffraction plane: (001) plane in the case of residual stress A
(110) plane in the case of residual stress B

TABLE 3

| | Constant Penetration Depth Method | | | | |
|---|---|---|---|---|---|
| | Residual Stress at Depth Location of Distance $d_{10}$ from Surface Side | | Residual Stress at Depth Location of Distance $d_{40}$ from Surface Side | | Presence/ Absence of |
| Sample Number | $A_{d10}$ (MPa) | $B_{d10}$ (MPa) | $A_{d40}$ (MPa) | $B_{d40}$ (MPa) | Minimum Point P3b |
| 1 | −102 | −1245 | 412 | 213 | Present |
| 2 | −87 | −1140 | 422 | 208 | Present |
| 3 | −60 | −918 | 519 | 330 | Present |
| 4 | 20 | −876 | 719 | 308 | Present |
| 5 | 50 | −812 | 1090 | 382 | Present |
| 6 | 260 | −734 | 1420 | 404 | Present |
| 7 | 383 | −662 | 1870 | 607 | Present |

TABLE 3-continued

| | Constant Penetration Depth Method | | | | |
|---|---|---|---|---|---|
| | Residual Stress at Depth Location of Distance $d_{10}$ from Surface Side | | Residual Stress at Depth Location of Distance $d_{40}$ from Surface Side | | Presence/ Absence of |
| Sample Number | $A_{d10}$ (MPa) | $B_{d10}$ (MPa) | $A_{d40}$ (MPa) | $B_{d40}$ (MPa) | Minimum Point P3b |
| 8 | 756 | −552 | 1980 | 660 | Present |
| 11 | 1058 | −54 | 2025 | 544 | Present |
| 12 | 1800 | 50 | 2828 | 205 | Absent |
| 13 | 3133 | 715 | 3134 | 710 | Absent |

<<Cutting Test>>
(Intermittent Process Test)

Each of the cutting tools of sample numbers 1 to 8 and sample numbers 11 to 13 produced as described above was used to measure, under the following cutting conditions, the number of times of making contact with a workpiece until chipping and detachment of the coating film occurred at a cutting edge ridgeline portion. Results thereof are shown in Table 4. It can be evaluated that as the number of times of making contact is larger, the cutting tool has a more excellent chipping resistance.

Test Conditions of Intermittent Process
Workpiece: FCD450 grooved material
Cutting speed: 250 m/min
Feed: 0.25 mm/rev
Depth of cut: 2 mm
Cutting fluid: wet type (Continuous Process Test)

Each of the cutting tools of sample numbers 1 to 8 and sample numbers 11 to 13 produced as described above was used to measure, under the following cutting conditions, a cutting time until the depth of a crater wear became 0.1 mm. Results thereof are shown in Table 4. It can be evaluated that as the cutting time is longer, the cutting tool has a more excellent crater wear resistance.

Test Conditions of Continuous Process
Workpiece: SCM435 round bar
Cutting speed: 250 m/min
Feed: 0.25 mm/rev
Depth of cut: 2 mm
Cutting fluid: wet type In view of the results of Table 4, each of the cutting tools of sample numbers 1 to 8 (Examples) attained such an excellent result that the number of times of making contact with the workpiece until the chipping and detachment occurred in the intermittent process was more than or equal to 5000. On the other hand, for each of the cutting tools of sample numbers 11 to 13 (Comparative Examples), the number of times of making contact in the intermittent process was less than 5000. From the above results, it was found that each of the cutting tools of the Examples (sample numbers 1 to 8) was excellent in chipping resistance.

In view of the results of Table 4, each of the cutting tools of sample numbers 1 to 8 (Examples) attained such an excellent result that the cutting time in the continuous process was more than or equal to 20 minutes. On the other hand, for each of the cutting tools of sample numbers 11 to 13 (Comparative Examples), the cutting time in the continuous process was less than 20 minutes. From the above results, it was found that each of the cutting tools of the Examples (sample numbers 1 to 8) was excellent in crater wear resistance.

Heretofore, the embodiments and examples of the present invention have been illustrated, but it has been initially expected to appropriately combine configurations of the embodiments and examples.

The embodiments and examples disclosed herein are illustrative and non-restrictive in any respect. The scope of the present invention is defined by the terms of the claims, rather than the embodiments and examples described above, and is intended to include any modifications within the scope and meaning equivalent to the terms of the claims.

TABLE 4

| | $2\theta$-$\sin^2\psi$ Method | | Intermittent Process Test Number of Times Making Contact | Continuous Process Test Continuous |
|---|---|---|---|---|
| Sample Number | Film Residual Stress $A_A$ (MPa) | Film Residual Stress $B_A$ (MPa) | Until Occurrence of Chipping (Number of Times) | Process Cutting Time (Minute) |
| 1 | 27 | −978 | 7218 | 24.0 |
| 2 | 182 | −912 | 7567 | 23.8 |
| 3 | 359 | −812 | 7012 | 24.2 |
| 4 | 589 | −692 | 6789 | 21.7 |
| 5 | 987 | −483 | 6080 | 22.5 |
| 6 | 1267 | −406 | 5463 | 22.3 |
| 7 | 1588 | −312 | 5698 | 20.9 |
| 8 | 1922 | −298 | 5039 | 21.6 |
| 11 | 2012 | −25 | 720 | 4.8 |
| 12 | 2099 | 128 | 819 | 3.6 |
| 13 | 3120 | 712 | 152 | 4.2 |

The above description includes features described below.
(Clause 1)
A method for manufacturing the cutting tool, the method comprising:
a first step of preparing the substrate including the rake face;
a second step of forming the coating film including the $\alpha$-$Al_2O_3$ layer on the rake face of the substrate using a chemical vapor deposition method; and
a third step of performing a blasting process onto the $\alpha$-$Al_2O_3$ layer at the rake face.
(Clause 2)
The method for manufacturing the cutting tool according to clause 1, wherein
the second step includes forming the $\alpha$-$Al_2O_3$ layer at a temperature of more than or equal to 1000° C. and less than or equal to 1100° C. under a pressure of more than or equal to 0.1 hPa and less than or equal to 100 hPa, and
the temperature is decreased continuously at a rate of more than or equal to 0.1° C./minute and less than or equal to 0.3° C./minute for a time of more than or equal to 30 minutes and less than 90 minutes at a final stage of the formation of the $\alpha$-$Al_2O_3$ layer.

REFERENCE SIGNS LIST

1: rake face; 2: flank face; 3: cutting edge ridgeline portion; 10: substrate; 20: $\alpha$-$Al_2O_3$ layer; 21: crystal grains oriented in (001); 22: crystal grains other than the crystal grains oriented in (001); 30: CVD apparatus; 31: substrate setting jig; 32: reaction container; 33: temperature adjusting apparatus; 34: gas inlet; 35: gas inlet pipe; 36: through hole; 40: coating film; 50: cutting tool; D1: virtual plane D1; D2: virtual plane D2; P1$a$: first a region; P2$a$: second a region; P3$a$: minimum point; P1$b$: first b region; P2$b$: second b region; P3$b$: minimum point; r1: region r1.

The invention claimed is:
1. A cutting tool comprising: a substrate including a rake face; and a coating film that coats the rake face, wherein
the coating film includes an $\alpha$-$Al_2O_3$ layer disposed on the substrate,
the $\alpha$-$Al_2O_3$ layer includes crystal grains of $\alpha$-$Al_2O_3$,
an area ratio of crystal grains oriented in (001) among the crystal grains is more than 50% and less than 90% in the $\alpha$-$Al_2O_3$ layer at the rake face, and
in a residual stress measurement performed in accordance with a 2$\theta$-$\sin^2\psi$ method using X rays,
a film residual stress $A_A$ determined based on a crystal plane interval of a (001) plane of the $\alpha$-$Al_2O_3$ layer at the rake face is more than 0 MPa and less than or equal to 2000 MPa, and
a film residual stress $B_A$ determined based on a crystal plane interval of a (110) plane of the $\alpha$-$Al_2O_3$ layer at the rake face is more than or equal to −1000 MPa and less than 0 MPa.
2. The cutting tool according to claim 1, wherein
the $\alpha$-$Al_2O_3$ layer has a thickness of more than or equal to 1 μm and less than or equal to 20 μm,
in a residual stress measurement performed in accordance with a constant penetration depth method using X rays at a region r1 interposed between a virtual plane D1 and a virtual plane D2, the virtual plane D1 being located at a distance $d_{10}$ from a surface of the $\alpha$-$Al_2O_3$ layer opposite to the substrate toward the substrate side, the distance $d_{10}$ being 10% of the thickness of the $\alpha$-$Al_2O_3$ layer, the virtual plane D2 being located at a distance $d_{40}$ from the surface of the $\alpha$-$Al_2O_3$ layer opposite to the substrate toward the substrate side, the distance $d_{40}$ being 40% of the thickness of the $\alpha$-$Al_2O_3$ layer,
a residual stress A determined based on the crystal plane interval of the (001) plane of the $\alpha$-$Al_2O_3$ layer at the rake face is more than or equal to −200 MPa and less than or equal to 2000 MPa, and
a residual stress B determined based on the crystal plane interval of the (110) plane of the $\alpha$-$Al_2O_3$ layer at the rake face is more than or equal to −1500 MPa and less than or equal to 700 MPa, and
a relational expression of A>B is satisfied.
3. The cutting tool according to claim 2, wherein
a stress distribution of the residual stress A has
a first a region in which the residual stress A is decreased continuously from the surface of the $\alpha$-$Al_2O_3$ layer opposite to the substrate toward the substrate side, and
a second a region which is located at the substrate side relative to the first a region and in which the residual stress A is increased continuously from the surface opposite to the substrate toward the substrate side, and
the first a region and the second a region are continuous to each other via a minimum point of the residual stress A.
4. The cutting tool according to claim 2, wherein
a stress distribution of the residual stress B has
a first b region in which the residual stress B is decreased continuously from the surface of the $\alpha$-$Al_2O_3$ layer opposite to the substrate toward the substrate side, and
a second b region which is located at the substrate side relative to the first b region and in which the residual stress B is increased continuously from the surface opposite to the substrate toward the substrate side, and
the first b region and the second b region are continuous to each other via a minimum point of the residual stress B.
5. The cutting tool according to claim 1, wherein
the coating film further includes one or more intermediate layers disposed between the substrate and the $\alpha$-$Al_2O_3$ layer, and
each of the intermediate layers includes a compound that is composed of at least one element selected from a group consisting of a group 4 element, a group 5 element, a group 6 element in a periodic table, Al and Si, and at least one element selected from a group consisting of C, N, B, and O.

* * * * *